United States Patent
Ryskoski

(10) Patent No.: US 6,868,353 B1
(45) Date of Patent: Mar. 15, 2005

(54) METHOD AND APPARATUS FOR DETERMINING WAFER QUALITY PROFILES

(75) Inventor: Matthew S. Ryskoski, Kyle, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 290 days.

(21) Appl. No.: 10/090,584

(22) Filed: Mar. 4, 2002

(51) Int. Cl.[7] .......................... G01N 37/00; G06F 19/00; H01L 21/00
(52) U.S. Cl. .......................... 702/84; 700/108; 700/109; 438/16; 438/17; 438/18
(58) Field of Search .......................... 702/82, 83, 84, 702/81; 700/108, 109, 110; 438/14, 16, 17, 18

(56) References Cited

U.S. PATENT DOCUMENTS 5,661,669 A * 8/1997 Mozumder et al. ............ 702/84
6,292,582 B1 * 9/2001 Lin et al. ..................... 382/149
6,601,411 B2 * 8/2003 MacDougall et al. .......... 65/378
6,650,955 B1 * 11/2003 Sonderman et al. ......... 700/108
6,691,068 B1 * 2/2004 Freed et al. ................ 702/187

* cited by examiner

Primary Examiner—Michael Nghiem
Assistant Examiner—Meagan S Walling
(74) Attorney, Agent, or Firm—Williams, Morgan & Amerson

(57) ABSTRACT

A method includes processing a workpiece in a process flow. Workpiece state trace data is collected for the workpiece during its processing in the process flow. A quality profile of the workpiece is generated based on the workpiece state trace data. A manufacturing system includes a plurality of tools configured to process a workpiece in a process flow and a quality monitor. The quality monitor is configured to collect workpiece slate trace data for the workpiece during its processing in the process flow generate a quality profile of the workpiece based on the workpiece state trace data.

31 Claims, 2 Drawing Sheets

METHOD AND APPARATUS FOR DETERMINING WAFER QUALITY PROFILES

BACKGROUND OF THE INVENTION

1. Field of the Invention

This invention relates generally to the field of semiconductor device manufacturing and, more particularly, to a method and apparatus for determining wafer quality profiles.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a group of wafers, sometimes referred to as a "lot," using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

During the manufacturing process, various metrology data is collected to allow automatic process control, fault detection and classification, defect identification, and performance measurement. Typically, the data collected is stored by the manufacturing system in its raw form. Extracting information from the data often requires intervention from engineering, and thus the expenditure of human capital. Typically, such data analysis is performed on a limited basis, such as during a troubleshooting investigation. Until such an investment of human capital is made, the quality characteristics of the devices in the wafer are not readily identifiable. The lack of analyzed data may result in the misprocessing of wafers and/or inadequate problem identification.

The present invention is directed to overcoming, or at least reducing the effects of, one or more of the problems set forth above.

SUMMARY OF THE INVENTION

One aspect of the present invention is seen in method including processing a workpiece in a process flow. Workpiece state trace data is collected for the workpiece during its processing in the process flow. A quality profile of the workpiece is generated based on the workpiece state trace data.

Another aspect of the present invention is seen in a manufacturing system including a plurality of tools configured to process a workpiece in a process flow and a quality monitor. The quality monitor is configured to collect workpiece state trace data for the workpiece during its processing in the process flow generate a quality profile of the workpiece based on the workpiece state trace data.

BRIEF DESCRIPTION OF THE DRAWINGS

The invention may be understood by reference to the following description taken in conjunction with the accompanying drawings, in which like reference numerals identify like elements, and in which.

Figure 1:
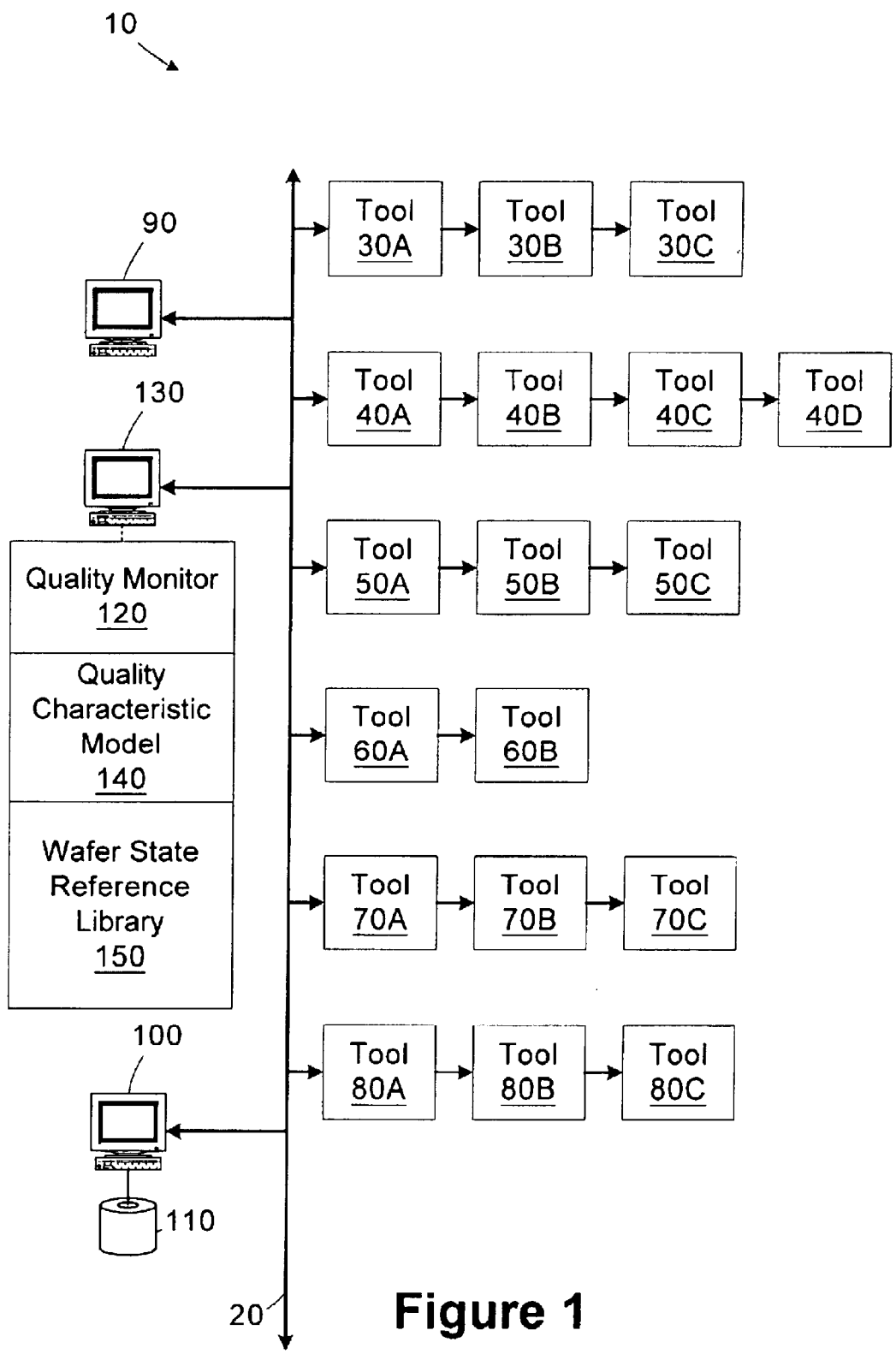
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces including, but not limited to microprocessors, memory devices, digital signal processors, application specific integrated circuits (ASICs), or other similar devices. The techniques may also be applied to workpieces other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a photolithography stepper. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any order or grouping. Additionally, the connections between the tools in a particular grouping are meant to represent only connections to the network 20, rather than only interconnections between the tools.

A process control server 90 directs the high level operation of the manufacturing system 10. The process control server 90 monitors the status of the various entities in the manufacturing system 10 and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc. The distribution of the processing and data storage functions amongst the different computers is generally conducted to provide independence and a central information store. Of course, a different number of computers may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Various metrology information is collected during the fabrication of the lots. For example, physical measurements, such as transistor gate critical dimensions, particle contamination, process layer thickness, etc. may be collected. Inspection data identifying defects (e.g., particle contamination defects, extra or missing pattern defects, electrical arc damage defects) in the process layers formed on the wafer may also be collected. Direct performance metrology measurements, such as wafer electrical tests (e.g., drive current, effective channel length, dielectric constant) may also be collected.

The manufacturing system 10 includes a quality monitor 120 executing on a workstation 130. The quality monitor 120 uses the metrology data (i.e., physical measurements, defect measurements, and performance test measurements) to generate a quality profile of the wafers processed by the manufacturing system 10. The quality profiles may be stored for each wafer, or for each lot of wafers, depending on the particular implementation. The particular metrology information used to generate the quality profile and the one or more quality characteristic metrics contained therein may vary depending on the particular workpiece being produced. For example, memory devices may have different quality profiles than microprocessors.

Exemplary quality characteristic metrics include an estimated yield parameter, an estimated grade parameter (e.g., estimated maximum clock speed), an estimated power consumption parameter, a film resistivity parameter, a film capacitance parameter, a defect density parameter, a feature dimension parameter, etc. Other quality characteristic metrics or combinations thereof may also be employed. Some of the quality characteristic metrics may correspond to metrology data that is gathered after subsequent processing steps. Such a quality characteristic metric is useful for estimating the value of that parameter prior to it being possible to measure it directly. For example, electrical parameters such as resistivity, speed, or power consumption, may be estimated early during the processing cycle, but measured definitively at a later processing point. After such definitive measurement, the quality characteristic metric may be replaced with the actual measured parameter.

The quality profile and accompanying quality characteristic metrics of a particular wafer or lot may change during the processing cycle. For example, deposition tools typically experience an increase in byproduct buildup between cleaning cycles. Hence, wafers processed immediately after the cleaning cycle is performed will have less particle contamination than wafers processed just prior to the performance of the cleaning cycle. If a particular lot passes through a deposition tool near the end of the time period between cleaning cycles, the particle contamination in the deposited process layer may be relatively high. This particle contamination may reduce the insulating properties of the process layer, resulting in a reduction in the anticipated grade of the devices in the lot. The increased particle contamination may also result in a lower anticipated yield for the lot. On the other hand, if the lot of wafers is processed in a deposition tool just after the cleaning cycle is performed, its estimated grade and yield may increase. Similar effects on estimated grade and yield may result from the effects of processing in other tools.

Preprocess and post-process metrology information collected as a particular lot passes through the manufacturing system 10 may be used by the quality monitor 120 to dynamically update the quality profile of the lot. At various steps in the process flow, the post-process metrology information may be correlated to estimated quality characteristics based on a quality characteristic model 140. The quality characteristic model 140 may be equation based or based on an empirical analysis of historical data.

The particular points in the process flow where the quality characteristics are updated depend on the particular implementation. Exemplary adjustment points include after the gate electrode has been formed (i.e., based on gate electrode physical dimensions), after formation of the first metal layer (i.e., based on drive current or effective channel length), after formation of an inter-level dielectric layer (i.e., based on measured dielectric constant), after formation of active source/drain regions (i.e., based on dimensions), after implant and thermal annealing (i.e., based on measured bulk resistivity, transistor threshold voltage, drive current, implant does and energy, implant anneal time and temperature), etc. The quality characteristic model 140 may actually include a plurality of individual models for estimating different quality characteristics based on information collected at the various estimation points.

Many different measurements, both physical and electrical, may be used for determining quality characteristic metrics. The data may represent raw data or mathematically processed data (e.g., averaged or integrated). For example, a measurement of thickness may be taken at various points across the wafer and averaged to determine the value used to generate the quality characteristic metrics. An exemplary, but not exhaustive, list of physical measurements includes a transistor gate critical dimension, a process layer thickness, a particle contamination count, and a transistor active region dimension. An exemplary, but not exhaustive, list of electrical measurements includes a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency. Also, process parameters may also be used for estimating quality characteristics. An exemplary, but not exhaustive, list of process parameters includes implant dose and energy, and anneal temperature and time.

One exemplary technique for incorporating the various metrology data includes the use of a multivariate model as the quality characteristic model 140. A wafer state reference library 150 includes a plurality of reference sets of trace data associated with previously processed wafers. A wafer state trace includes the various data collected during the processing of a particular wafer or lot of wafers. For example, a trace for a current wafer may include the physical, electrical, and process data described above. Of course, not all of the elements may be included and others may be added. A trace may include a plurality of discrete vectors of data collected over time or a single vector representing a single measurement or set of measurements.

Quality characteristic metrics are associated with each reference trace in the wafer state reference library 150. For example, each reference trace may have an associated yield metric, grade metric, power consumption metric, etc. The quality characteristic metrics may be generated from post-processing metrology data collected for the actual wafers used to generate the reference traces. The wafer state reference library 150 may be periodically updated as additional data is collected for additional wafers 110. An exemplary state monitoring and comparison software application is ModelWare™ offered by Triant, Inc. of Nanaimo, British Columbia, Canada Vancouver, Canada.

At the points where the quality characteristic profile is to be updated, as described above, data is added to the current wafer state trace from additional metrology steps. The quality monitor 120 compares the current wafer state trace data to the reference traces in the wafer state reference library 150 and determines the reference trace closest to the current trace. Various techniques for matching the current trace to a reference trace are well known to those of ordinary skill in the art. For example, a minimum least squares technique may be employed. The quality characteristic metric associated with the selected reference trace is used to generate the quality profile. The wafer state reference library 150 may include separate associated metrics for each of the quality characteristics provided to the process controller 150. In another embodiment, the wafer state reference library 150 may consist of a plurality of libraries, each associated with a different quality characteristic. The data elements used to match the current wafer state trace to the reference wafer state trace may vary between the different libraries. For example, wafer state data that does not have an impact of yield may not be used in the matching process for a separate library associated with yield quality characteristic metrics.

As the wafer or lot progresses through the process flow, its associated wafer state trace gains data. For example, when the photoresist pattern used to etch the gate electrodes is formed, the wafer state trace may include defect data, such as missing or extra patterns or particle contamination. The defect data may include the location and nature of the particular defects allowing comparison to other wafers having similar defects, thus allowing the determination of the effects of those similar defects. The wafer state reference library 150 may be used to generate a yield quality metric based on the defect data and the reference traces from previous wafers having similar defects or defect counts. If the yield estimate is sufficiently low, the photoresist layer may be stripped and reformed to attempt to increase the yield. After the gate electrodes are formed, additional metrology data regarding the critical dimensions of the gate electrodes may be added to the wafer state trace, and a grade quality characteristic metric may be calculated. Subsequently, after the formation of the source/drain regions, implant and annealing process parameters may be added to the wafer state trace, and the grade and/or yield metrics may be updated. As the wafer progresses through the process flow more data is available to fill out the wafer state trace, and the predictions in the quality profile generally become more accurate.

Figure 2:
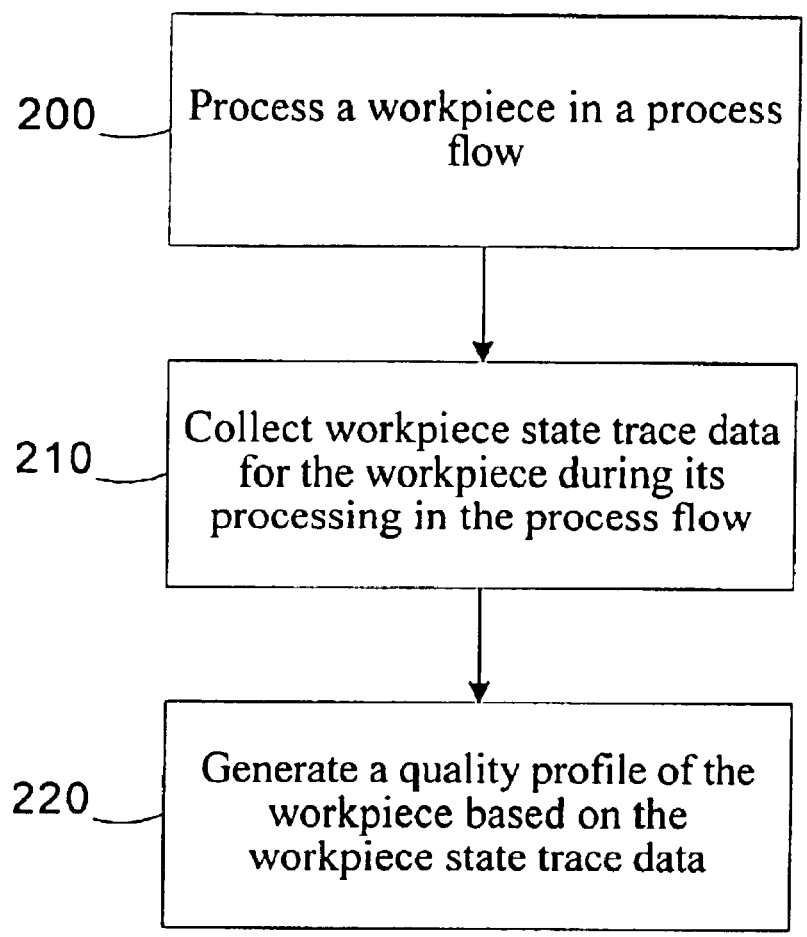
FIG. 2 is a simplified flow diagram of a method for determining wafer quality profiles in accordance with another embodiment of the present invention.

Turning now to FIG. 2, a simplified flow diagram of a method for prioritizing production lots based on grade estimates and output requirements in accordance with another embodiment of the present invention is provided. In block 200, a workpiece is processed in a process flow. In block 210, workpiece state trace data is collected for the workpiece during its processing in the process flow. In block 220, a quality profile of the workpiece is generated based on the workpiece state trace data.

Calculating the quality profile and updating the quality characteristic metrics contained therein throughout the process flow allows operators and other entities (e.g., automatic process controllers) to assess the information extracted from the metrology data collected thus far to see the predicted quality characteristics. Automatically creating and dynamically updating the quality profile saves engineering time and human capital resources, as individual analysis need not be performed by engineering for every wafer analyzed. The information in the quality profile may have numerous uses, such as fault detection, process control, scheduling, manufacturing output prediction, etc.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    processing a workpiece in a process flow;
    collecting workpiece state trace data for the workpiece during its processing in the process flow;
    generating a quality profile of the workpiece based on the workpiece state trace data; and
    periodically updating the workpiece state trace data and updating the associated quality profile as the workpiece progressing through the process flow.

2. The method of claim 1, wherein collecting the workpiece state trace data further comprises collecting metrology data associated with the workpiece.

3. The method of claim 2, wherein the workpiece comprises a semiconductor device, and collecting the metrology data further comprises at least one of a transistor gate critical dimension, a process layer thickness, a particle contamination count, and a transistor active region dimension.

4. The method of claim 2, wherein the workpiece comprises a semiconductor device, and collecting the metrology data further comprises measuring at least one of a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency.

5. The method of claim 1, wherein collecting the workpiece state trace data further comprises collecting defect data associated with the workpiece.

6. The method of claim 5, wherein the workpiece comprises a semiconductor device, and collecting the defect data further comprises identifying at least one of a missing pattern defect, an extra pattern defect, a particle contamination defect, and an electrical arc damage defect.

7. The method of claim 1, wherein collecting the workpiece state trace data further comprises collecting process data associated with the processing of the workpiece in the process flow.

8. The method of claim 7, wherein the workpiece comprises a semiconductor device, and collecting the process data further comprises measuring at least one of an implant dose and energy, and an anneal temperature and time.

9. The method of claim 1, wherein generating the quality profile further comprises generating at least one quality characteristic metric associated with the workpiece.

10. The method of claim 9, wherein generating the quality characteristic metric further comprises generating at least one of a yield characteristic metric, a grade characteristic metric, a power consumption characteristic metric, a film resistivity metric, a film capacitance metric, a defect density metric, and a feature dimension metric.

11. The method of claim 9, wherein generating the quality characteristic metric further comprises determining the quality characteristic based on the collected workpiece state trace data and an equation based model.

12. The method of claim 9, wherein generating the quality characteristic metric further comprises determining the quality characteristic based on the collected workpiece state trace data and an empirical model.

13. The method of claim 12, wherein generating the quality characteristic metric further comprises:
    comparing the collected workpiece state trace data to a library of reference workpiece state traces, each reference workpiece state trace having an associated quality characteristic metric;

selecting a reference workpiece state trace closest to the collected workpiece state trace data; and selecting the quality characteristic metric associated with the selected reference workpiece state trace.

14. The method of claim 1, wherein processing the workpiece further comprises processing a semiconductor device.

15. The method of claim 14, wherein processing the semiconductor device further comprises processing at least one of a microprocessor, a memory device, a digital signal processor, and an application specific integrated circuit.

16. A manufacturing system, comprising:
a plurality of tools configured to process a workpiece in a process flow; and
a quality monitor configured to collect workpiece state trace data for the workpiece during its processing in the process flow, generate a quality profile of the workpiece based on the workpiece state trace data, and periodically update the workpiece state trace data and update the associated quality profile as the workpiece progresses through the process flow.

17. The system of claim 16, wherein the workpiece state trace data further comprises metrology data associated with the workpiece.

18. The system of claim 17, wherein the workpiece comprises a semiconductor device, and the metrology data further comprises at least one of a transistor gate critical dimension, a process layer thickness, a particle contamination count, and a transistor active region dimension.

19. The system of claim 17, wherein the workpiece comprises a semiconductor device, and the metrology data further comprises at least one of a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency.

20. The system of claim 16, wherein the workpiece state trace data further comprises defect data associated with the workpiece.

21. The system of claim 20, wherein the workpiece comprises a semiconductor device, and the defect data further comprises at least one of a missing pattern defect, and extra pattern defect, a particle contamination defect, and an electrical arc damage defect.

22. The system of claim 16, wherein the workpiece state trace data further comprises process data associated with the processing of the workpiece in the process flow.

23. The system of claim 22, wherein the workpiece comprises a semiconductor device, and the process data further comprises at least one of an implant dose and energy, and an anneal temperature and time.

24. The system of claim 16, wherein the quality profile further comprises at least one quality characteristic metric associated with the workpiece.

25. They system of claim 24, wherein the quality characteristic metric further comprises at least one of a yield characteristic metric, a grade characteristic metric, a power consumption characteristic metric, a film resistivity metric, a film capacitance metric, a defect density metric, and a feature dimension metric.

26. The system of claim 24, wherein the quality monitor is further configured to determine the quality characteristic based on the collected workpiece state trace data and an equation based model.

27. They system of claim 24, wherein the quality monitor is further configured to determine the quality characteristic based on the collected workpiece state trace data and an empirical model.

28. The system of claim 27, wherein the quality monitor is further configured to compare the collected workpiece state trace data to a library of reference workpiece state traces, each reference workpiece state trace having an associated quality characteristic metric, select a reference workpiece state trace closest to the collected workpiece state trace data, and select the quality characteristic metric associated with the selected reference workpiece state trace.

29. The system of claim 16, wherein the workpiece further comprises a semiconductor device.

30. The system of claim 29, wherein the semiconductor device further comprises at least one of a microprocessor, a memory device, a digital signal processor, and an application specific integrated circuit.

31. A manufacturing system, comprising:
means for processing a workpiece in a process flow;
means for collecting workpiece state trace data for the workpiece during its processing in the process flow;
means for generating a quality profile of the workpiece based on the workpiece state trace data; and
means for periodically updating the workpiece state trace data and update the associated quality profile as the workpiece progresses through the process flow.

* * * * *